(12) United States Patent
Ohno et al.

(10) Patent No.: US 6,188,630 B1
(45) Date of Patent: Feb. 13, 2001

(54) SEMICONDUCTOR MEMORY DEVICE

(75) Inventors: Takashi Ohno; Hitoshi Doi, both of Tokyo (JP)

(73) Assignee: Oki Electric Industry Co., Ltd., Tokyo (JP)

(*) Notice: Under 35 U.S.C. 154(b), the term of this patent shall be extended for 0 days.

(21) Appl. No.: 09/460,982

(22) Filed: Dec. 15, 1999

(30) Foreign Application Priority Data

Jan. 28, 1999 (JP) .................................................. 11-02072

(51) Int. Cl.⁷ ..................................................... G11C 8/00

(52) U.S. Cl. ........................................ 365/230.03; 365/63

(58) Field of Search ........................ 365/230.03, 230.06, 365/51, 63

(56) References Cited

U.S. PATENT DOCUMENTS

| | | | |
|---|---|---|---|
| 5,495,444 | * 2/1996 | Okubo et al. | 365/230.03 |
| 5,862,095 | * 1/1999 | Takahashi et al. | 365/230.03 |
| 5,883,851 | * 3/1999 | Lee | 365/230.03 |
| 5,970,019 | * 10/1999 | Suzuki et al. | 365/230.03 |

* cited by examiner

*Primary Examiner*—Trong Phan
(74) *Attorney, Agent, or Firm*—Jones Volentine, LLC (57) ABSTRACT

A semiconductor memory device includes first through fourth memory blocks. A first block-selection signal is used to select the first and third memory blocks, to output data from the first memory block to the first data line and also to output data from the fourth memory block to the second data line. A second block-selection signal is used to select the second and third memory blocks, to output data from the second memory block to the second data line and also to output data from the third memory block to the first data line.

21 Claims, 6 Drawing Sheets

FIG.8

SEMICONDUCTOR MEMORY DEVICE

BACKGROUND OF THE INVENTION

Field of the Invention

The present invention relates to a semiconductor memory device and more particularly to a synchronous semiconductor memory device.

Description of the Related Art

A synchronous DRAM, one of the conventional synchronous semiconductor memory devices, comprises: a plurality of memory cells; a plurality of bit lines to which are respectively given potentials based on the data sent from the plurality of memory cells; a plurality of sense-amplifiers which respectively amplify the potential of the plurality of bit lines; and a plurality of column switches respectively connected between the plurality of bit lines and a plurality of data lines.

In the synchronous DRAM, the column-selection signal is given to sequentially select column switches, so that potentials based on the data of the memory cells that correspond to thus selected column switches are sequentially given to data lines.

The conventional synchronous DRAM sequentially outputs to the external the data based on a potential sent to the data line, in response to the leading edge of the clock signal.

The conventional synchronous DRAM turns ON the column switches one by one to sequentially send to the data line a potential based on the data of mutually adjacent two memory cells, which therefore takes a considerably long time to do so.

With this, in the array configuration of the conventional synchronous DRAMs, in order to implement such a double-data-rate synchronous DRAM which outputs a potential based on the data of mutually adjacent two memory cells, it is necessary to lengthen the period of the clock signal, thus leading to a problem in that the DRAM cannot operate speedily.

Further, the synchronous DRAM includes in each memory block a great many sense-amplifiers. Those sense-amplifiers, each of which is connected to the power supply to activate itself, have mutually different distances between the power supply and themselves.

Therefore, the sense-amplifier most distant from the power supply suffers from a voltage droop due to a large wiring resistance between itself and the power supply.

This leads to decreases in the speed for the sense-amplifier to amplify the potential of bit lines, thus causing a problematical drop in the operational margin of the synchronous DRAM as a whole.

SUMMARY OF THE INVENTION

To solve the above-mentioned problems, the present invention provides a semiconductor memory device which comprises first, second, third, and fourth memory blocks each of which comprises: word lines; memory cells connected to the above-mentioned word lines, to store data therein; bit lines to which are given potentials based on data stored in the above-mentioned memory cells, when the above-mentioned word lines are selected; and sense-amplifiers which amplify the potential sent to the above-mentioned bit lines, further comprising: a first transfer circuit which is coupled between the above-mentioned bit lines of the above-mentioned first memory block and first data lines, to be conductive in response to the signal value of a first column-selection signal and a first block-selection signal; a second transfer circuit which is coupled between the above-mentioned bit lines and first data lines and a second data line and first data lines, to be conductive in response to the signal value of a second column-selection signal and the signal value of a second block-selection signal; a third transfer circuit which is coupled between the above-mentioned bit lines of the above-mentioned third memory block and the above-mentioned first data line, to be conductive in response to the signal value of a third column-selection signal and the signal value of the above-mentioned second block-selection signal; and a fourth transfer circuit which is coupled between the above-mentioned bit lines of the above-mentioned fourth memory block and the above-mentioned second data line, to be conductive in response to the signal value of a fourth column-selection signal and the value of the above-mentioned first block-selection signal.

DESCRIPTION OF THE PREFERRED EMBODIMENTS

Figure 1:
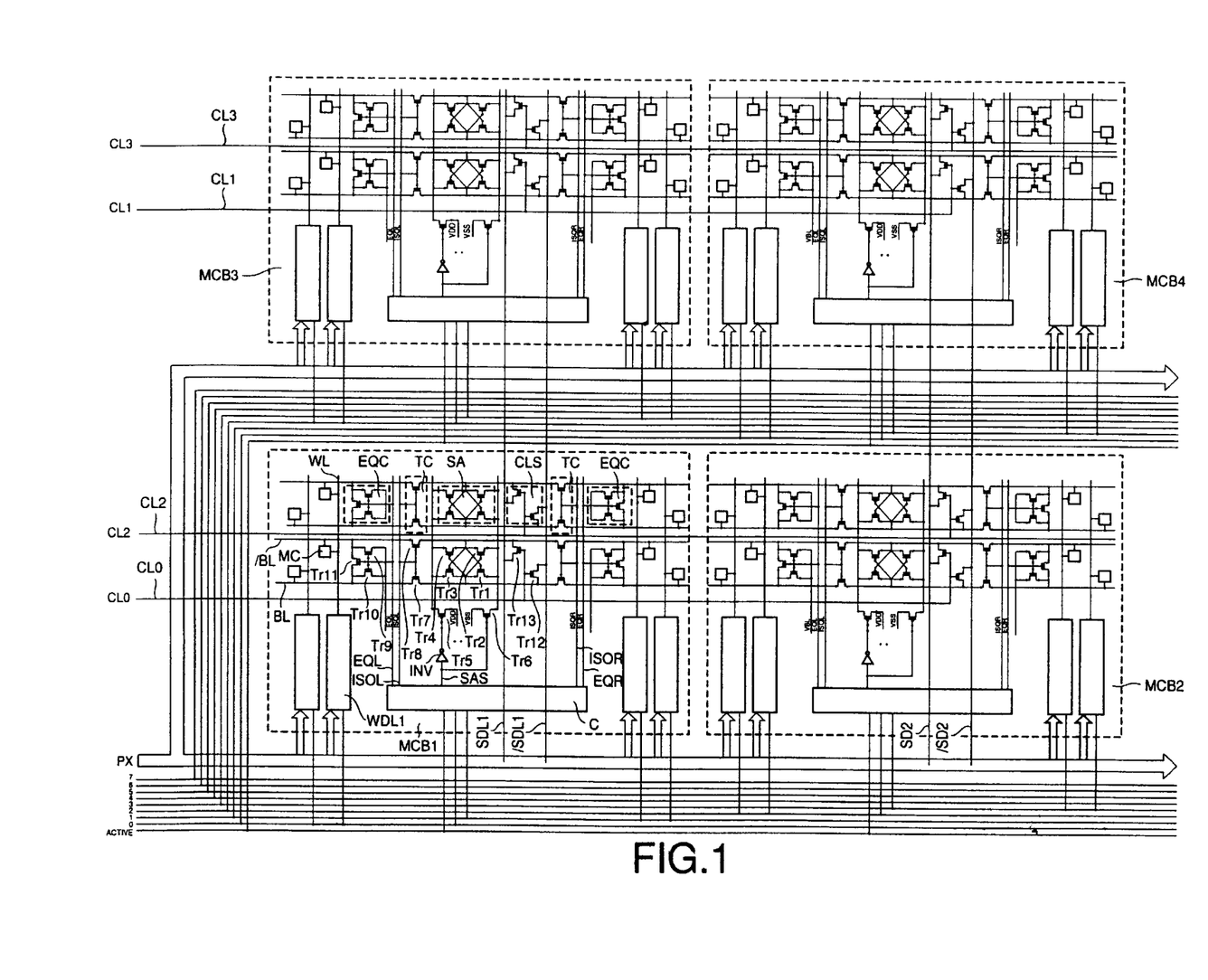
FIG. 1 is a circuit diagram of a synchronous DRAM according to a first embodiment of the present invention.

FIG. 1 is a circuit diagram of a synchronous DRAM according to the first embodiment of the present invention.

Figure 2:
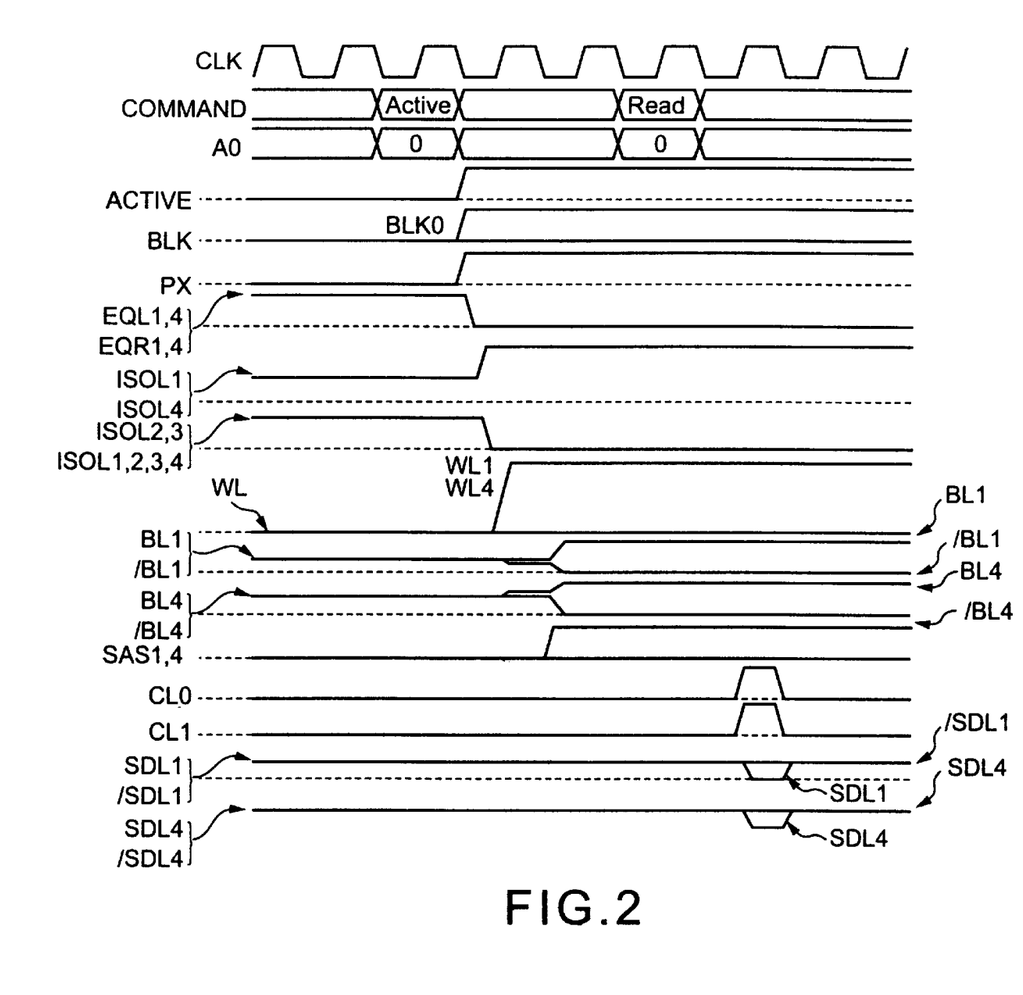
FIG. 2 is a timing chart for the synchronous DRAM of FIG. 1.

FIG. 2 is a timing chart for the synchronous DRAM of FIG. 1.

With reference to FIGS. 1 and 2, the following will describe the synchronous DRAM according to the first embodiment of the present invention.

The synchronous DRAM according to the present embodiment comprises at least four memory blocks of a first memory block MCB1, a second memory block MCB2, a third memory block MCB3, and a fourth memory block MCB4.

These four memory blocks are described below.

Each of these memory blocks comprises: a plurality of word lines WL extending in the row direction; a plurality of bit lines BL and /BL extending in the column direction; a plurality of memory cells MC positioned at the intersections between the plurality of word lines WL and the plurality of bit lines BL and /BL, to store data; a plurality of word-line drivers WD which select each of the plurality of word lines WL; a plurality of sense-amplifiers SA which amplify the potential of each pair of the plurality of bit lines (BL, /BL); a plurality of bit-line potential-fixing circuits EQC; a plurality of transfer circuits TC; a plurality of column switches CLS which respond to the signal values of the column-selection signal given to column-selection signal lines CL0, CL1, . . . , to output the output signal of the corresponding sense-amplifier SA to the corresponding sub-data line pair (SDL1, /SDL1) or (SDL2, /SDL2); a control circuit C which outputs the Sense-Amplifier Activate signal SAS, the Equalize signals EQL and EQR, and the isolation signals ISOL and ISOR.

Each bit-line potential-fixing circuit EQC is connected to the corresponding bit-line pair (BL, /BL), to fix the potential of the corresponding bit-line pair (BL, /BL) to a same potential in response to the signal value of the Equalize signal EQL or EQR.

Each transfer circuit TC is positioned between the corresponding bit-line pair (BL, /BL) and the corresponding sense-amplifier SA. Each transfer circuit TC transfers to the corresponding sense-amplifier SA the potential of the corresponding bit-line pair (BL, /BL) in response to the signal value of the isolation signal ISOL or ISOR.

In each memory block, on both sides of the sense-amplifiers SA are disposed the memory cells MCs, the word lines WLs, the bit lines BL and /BL, the bit-line potential-fixing circuits EQC, and the transfer circuits TC.

Each sense-amplifier SA comprises two NMOS transistors Tr1 and Tr2 and MPOS transistors Tr3 and Tr4. One ends of the Tr5 PMOS transistors Tr3 and Tr4 are connected to one end of PMOS transistor. The other end of the PMOS transistor Tr5 is connected to the power supply. The PMOS transistor Tr5 sends the power supply potential VDD to the Two PMOS transistors Tr3 and Tr4 in response to the signal value of the output of an inverter INV to which the Sense-Amplifier Activate signal SAS is input. One end of each of the NMOS transistors Tr1 and Tr2 is connected to one end of the NMOS transistor Tr6. The other end of the NMOS transistor Tr6 is connected to the ground. The NMOS transistor Tr6 sends the ground potential VSS to the NMOS transistors Tr1 and Tr2 in response to the signal value of the Sense-Amplifier Acivate signal SAS. The other ends of the NMOS transistor Tr1 and the PMOS transistor Tr3 are connected to the gate of the NMOS transistor Tr2 and the PMOS transistor Tr4 respectively. The other ends of the NMOS transistor Tr2 and the PMOS transistor Tr4 are conencted to the gates of the NMOS transistor Tr1 and the PMOS transistor Tr3 respectively.

The transfer circuits TC's disposed on both sides of the sense-amplifiers Sa transfer the potential of the corresponding bit-line pair (BL, /BL) to the corresponding sense-amplifier SA in response to the signal values of the isolation signals ISOL and ISOR respectively. Each transfer circuit TC comprises two NMOS transistors Tr7 and Tr8. On end of each of the NMOS transistors Tr7 and Tr8 is connected to the bit lines BL and /BL respectively. The gates of the NMOS transistors Tr7 and Tr8 are provided with the isolation signals. The other end of the NMOS transistor Tr7 is connected to the other ends of the NMOS transistor Tr8 and the PMOS transistor Tr3. The other end of the NMOS transistor Tr8 is conencted to the other ends of the NMOS transistor Tr2 and the PMOS transistor 4.

Also, the bit-line potential-fixing circuits EQC disposed on both sides of the sense-amplifiers fix the potential of the corresponding bit-line pair to a same potential in response to the signal value of the Equalize signals EQL and EQR respectively. The bit-line potential-fixing circuit EQC comprises NMOS transistors Tr9, Tr10, and Tr11. The NMOS transistors Tr9 and Tr10 are connected in series between a pair of bit lines (BL, /BL). The NMOS 11 is connected between a pair of the bit lines (BL, /BL).

The gates of the NNOS transistors Tr9, Tr10, and Tr11 are provided with the Equalize signal. The interconnection of the NMOS transistors Tr9 and Tr10 is connected to a terminal of a predetermined potential in order to set the bit line to a predetermined potential.

The control circuit C outputs the Sense-Amplifier Activate signal SAS, the Equalize signals EQL and EQR, and the isolation signals ISOL and ISOR in response to the signal value of the active signal given to the operation signal line ACTIVE and that of the block selection signal given to the block selection line BLK0 to BLK7.

Each memory block is set to the selection state by a potential of the active signal and a potential of the block selection signal.

The control circuit of the memory block MCB 1 is connected to the operation signal line ACTIVE and the block selection signal lines BLK0 and BLK1. This control circuit C puts the memory block MCB1 into the selection state when either one of the block selection signal given to the block-selection signal line BLK0 and that given to the block-selection signal line BLK1 becomes high and, at the same time, a high level of the active signal is input.

The word-line driver WD on the left side of the sense-amplifiers SA of the memory block MCB1 is connected to the block selection signal line BLK0 and an address line PX. The word-line driver WD on the right side of the sense-amplifiers of the memory block MCB1 is connected to the block-selection signal BLK1 and the address line PX.

The control circuit C of the memory block MCB2 is connected to the operation signal line ACTIVE and the block-selection signal lines BLK2 and BLK3. This control circuit C puts the memory block MCB2 into the selection state when either one of the block-selection signal given to the block-selection signal line BLK2 and that given to the block-selection signal line BLK3 becomes high and, at the same time, a high level of the active signal is input.

The word-line driver WD on the left side of the sense-amplifiers SA of the memory block MCB2 is connected to the block-selection signal line BLK2 and the address line PX. The word-line driver WD on the right side of the sense-amplifiers of the memory block MCB2 is connected to the block-selection signal line BLK3 and the address line PX.

The control circuit C of the memory block MCB3 is connected to the operation signal line ACTIVE and the block-selection signal lines BLK2 and BLK3. This control circuit puts the memory block MCB3 into the selection state when either one of the block-selection signal given to the block-selection signal line BLK2 and that given to the block-selection signal line BLK3 and, at the same time, a high level of the active signal is input.

The word-line driver WD on the left side of the sense-amplifiers of the memory block MCB3 is connected to the block-selection signal line BLK2 and the address line PX. The word-line driver WD on the right side of the memory block MCB3 is connected to the block-selection signal line BLK3 and the address line PX.

The control circuit C of the memory block MCB4 is connected to the operation signal line ACTIVE and the block-selection signal lines BLK0 and BLK1. This control circuit C puts the memory block MCB4 into the selection state when either one of the block-selection signal given to the block-selection signal line BLK0 and that given to the block-selection signal line BLK1 becomes high and, at the same time, a high level of the active signal is input.

The word-line driver WD on the left side of the sense-amplifiers of the memory block MCB4 is connected to the block-selection signal line BLK0 and the address line PX. The word-line driver WD on the right side of the sense-amplifiers of the memory block MCB4 is connected to the block-selection signal line BLK1 and the address line PX.

The following will explain the column switches CLS's in the memory blocks 1 and 4. Each column switch CLS comprises NMOS transistors Tr12 and Tr13. One end of the NMOS transistor Tr12 is connected to the bit line BL via the corresponding NMOS transistor 7, while the other end of the NMOS transistor 12 is connected to the sub-data line /SDL1. One end of the NMOS transistor 12 is connected to the bit line /BL via the corresponding NMOS transistor 8, while the other end of the NMOS transistor 13 is connected to the sub-data line SDL1. Transistors Tr12 and Tr13 of each column switch are connected to the corresponding column-selection signal line.

The following will explain the column switches CLS's in the memory blocks MCB2 and MCB4. They are provided for each bit-line pair. Each column switch CLS comprises NMOS transistors Tr12 and Tr13. One end of the NMOS transistor Tr12 is connected to the bit line BL via the corresponding NMOS transistor Tr7. The other end of the NMOS transistor Tr12 is connected to the sub-data line /SDL2. One end of the NMOS transistor Tr13 is connected to the bit line /BL via the corresponding NMOS transistor Tr8. The other end of the NMOS transistor Tr13 is connected to the sub-data line SDL2.

The columns switches of the same column of the first and second memory blocks are connected to the corresponding common column-selection signal line CL. The column switches of the same column of the third and fourth memory blocks are connected to the corresponding common column-selection signal line CL.

In the first and fourth memory blocks, the word-line drivers WD on both sides of the sense-amplifiers SA are put into the operative state by the signal values of the block-selection signals BLK0 and BLK1 respectively.

In the second and third memory blocks, the word-line drivers WD on both sides of the sense-amplifiers SA are put into the operative state by the signal values of the block-selection signal BLK2 and BLK3 respectively. A word-line driver WD further selected by the X address from among the word-line drivers WD thus put into the operative state provides a high level of the word line WL connected thereto.

In the synchronous DRAM according to the embodiment of the present invention, the data corresponding to odd-numbered-column addresses in the conventional memory array is stored in the first memory block, while the data corresponding to even-numbered-column addresses is stored in the fourth memory block. Similarly, the data corresponding to odd-numbered-column addresses in the conventional memory block is stored in the second memory block, while the data corresponding to even-numbered-column addresses is stored in the fourth memory block.

Now, the following will explain the operations of the synchronous DRAM according to the embodiment of the present invention.

FIG. 2 is a timing chart for the synchronous DRAM according to the embodiment of the present invention.

In FIG. 2, EQL1 and EQL4 are the Equalize signals for the first and fourth memory blocks respectively.

First, the following will explain the state of each component of each memory block in the initial state where a low-level active signal is input to each memory block.

The control circuit C outputs the high-level Equalize signals EQL and EQR, the isolation signals ISOL and ISOR which are of the intermediate level between the high and low levels, and the low-level Sense-Amplifier Activate signal SAS.

Each word line is set to a low level because the block selection signals given to the block-selection signal lines BLK0 through BLK7 are both of a low level.

Each bit-line pair (BL, /BL) is set to the same potential of ½ VDD because the Equalize signals EQL and EQR are both of a high level. The transistors Tr7 and Tr8 of the transfer circuits TC on both sides of the sense-amplifiers SA are in a conductive state because the isolation signals ISOL and ISOR are of the intermediate level.

The NMOS transistor Tr6 is in a non-conductive state because the Sense-Amplifier Activate signal is of a low level. The PMOS transistor Tr5 is in a non-conductive state because the output signal of the inverter INV is of a high level.

With this, the sense-amplifiers SA is not given the power-supply potential VDD nor the ground potential VSS via the NMOS Tr6 or PMOS Tr5.

Also, the NMOS transistors Tr12 and Tr13 are set in a non-conductive state because the column-selection signal given to each column-selection line outputs a low level. The sub-data lines SDL1 and /ADL1 and the sub-data lines SDL2 and /SDL2 are set to a high level.

Next, the following will explain how to read out data from the first and fourth memory blocks.

First, a high level of the active signal is given to each memory block.

Next, of the block-selection lines BLK0 through BLK7, the BLK0 block-selection signal becomes high, to select the first and fourth memory blocks connected to the block-selection line BLK0. Also, the X address signal PX is output to each memory block, to select the word-line driver WD on the left side of each sense-amplifier SA in the first and fourth memory blocks.

The following will explain the operations of each of the first and fourth memory blocks selected.

In response to a high level of the active signal and a high level of the block-selection signal line BLK0, the control circuit C outputs the low-level Equalize signals EQLZ and EQR, the high-level isolation signal ISOL, and the low-level isolation signal ISOR.

Also, the selected word-line driver WD on the left side of the sense-amplifiers SA provides a high level of the word line WL connected thereto.

Now, the address of a word line WD which is to become high in the first memory block and the address of a word line WL which is to become high in the fourth memory block correspond to the same address in the conventional circuit.

A plurality of bit-line pairs are given respective potentials from a plurality of memory cells MC connected to the word lines WL set at a high level, based on the data stored in those memory cells MC, to bring about a potential difference among the bit-line pairs.

Since the isolation signal ISOL is of a high level, the NMOS transistors Tr7 and Tr8 of the each transfer circuit TC on the left side of the each sense-amplifier SA are set in a conductive state. A potential given to each bit-line pair disposed on the left side of each sense-amplifier is output to each corresponding sense-amplifier. Since the isolation signal ISOR is of a low level at the same time, the NMOS transistors Tr7 and Tr8 of the transfer circuit TC on the right side of the sense-amplifier SA are set in the non-conductive state.

Next, the control circuit C outputs a high level of the Sense-Amplifier Activate signal SAS. With this, the NMOS Tr6 and the PMOS Tr5 are set in the conductive state, to give the power-supply potential and the ground potential VSS to each sense-amplifier SA. With this, each amplifier amplifies a potential difference given between the corresponding bit-line pairs 8BL, /BL).

The first memory block's bit line BL becomes high and the second memory block's bit line /BL becomes low.

The fourth memory block's bit line BL becomes low and the fourth memory block's bit line /BL becomes high.

Next, the column-selection signal given to a column selection line CL0 of the column selection lines is set to a high level. With this, the column switch CLS, of the first memory block, connected to the column selection line CL0 gives the potential difference of the bit-line pairs (BL, /BL) amplified by the corresponding sense-amplifier to the sub-data-line pair (/SDL1, SDL1). With this, the sub-data-line pair (/SDL1, SDL1) is given the potential based on the data stored in the memory cells in the first memory block.

The sub-data line SDL1 becomes low, while the sub-data line /SDL1 becomes high.

Also, when the column-selection signal given to the column selection line CL0 is set to a high level and, at the same time, the column-selection signal given to the column selection line CL1 is set to a high level, the column switch CLS, of the fourth memory block, connected to the column selection line CL1 gives a potential difference of the bit-line pair (BL, /BL) amplified by the corresponding sense-amplifier SA to the sub-data-line pair (/SDL2, SDL2). With this, the sub-data-line pair (/SDL2, SDL2) is given the potential based on the data stored in the memory cells of the fourth memory block.

The sub-data line SDL2 becomes high and the sub-data line /SDL2 becomes low.

The sub-data-line pairs (SDL1, /SDL1) and (SDL2, /SDL2) are connected to a subsequent-stage selector circuit SEL shown in FIG. 9. This selector circuit SEL outputs a potential which responds to a potential given to the sub-data-line pair (SDL1, /SDL1) in response to the leading edge of the clock signal and also outputs a potential which corresponds to a potential given to the sub-data-line pair (SDL2, /SDL2) in response to the trailing edge of the clock signal.

Next, the following will explain the second and third memory blocks which are not selected.

In the second and third memory blocks not selected, the control circuit C are provided with a high level of the active signal ACT and a low level of the block-selection signals BLK2 and BLK3, to output the high-level Equalize signals EQL and EQR, the low-level isolation signals ISOL and IOSR, and the low-level Sense-Amplifier Activate signal SAS.

Each word-line driver WD is in the non-selected state because the block-selection signals BLK2 and BLKS are both of a low level. Each word line is set to a low level.

Each bit-line pair (BL, /BL) is set to the same potential of ½ VDD because the Equalize signals EQL and EQR are of a high level. Transistors Tr7 and Tr8 of each transfer circuit TC are in the conductive state because the isolation signals IOSL and ISOR are of a low level.

The NMOS Tr6 is in the non-conductive state because the Sense-Amplifier Activate signal is of a low level. The PMOS5 is in the non-conductive state because the output signal of the inverter INV is of a high level.

With this, the sense-amplifier SA is not given the power-supply potential VDD nor the ground potential VSS, thus being rendered inoperative.

In the present embodiment, the data corresponding to the odd-numbered-column addresses in the conventional memory block is stored in the first memory block, and the data corresponding to the even-numbered-column addresses is stored in the fourth memory block, thus making it possible to output simultaneously the data stored in the adjacent addresses in the conventional memory block from the first and fourth memory blocks respectively. With this, it is possible to implement a double-data-rate synchronous DRAM that can output the data at the timing of both leading edge and trailing edge of the clock signal having the same or higher frequency as the conventional one, by means of the selector circuit shown in FIG. 9.

Also, the present embodiment features an advantage that since the sub-data-line pairs are used in common in the first and third memory blocks and also in the second and fourth memory blocks, the circuits can be implemented in a smaller configuration than the case where each memory block is provided with its own sub-data lines.

Also, since the memory array is divided into four memory blocks, the number of sense-amplifiers in each memory block can be reduced. With this, by, for example, establishing the power-supply line between one memory block and another to make approximately equal to each other the distances between the power-supply line and the sense-amplifier of these memory blocks, it is possible to improve the read-out performance of the synchronous DRAM as a whole.

FIGS. 3 through 7 show various examples of reading out the data from the synchronous DRAM according to one embodiment.

The synchronous DRAM according to the present embodiment is capable of setting the burst length. The burst length referred to here indicates the number of data pieces that can be read out at a time.

Figure 3:
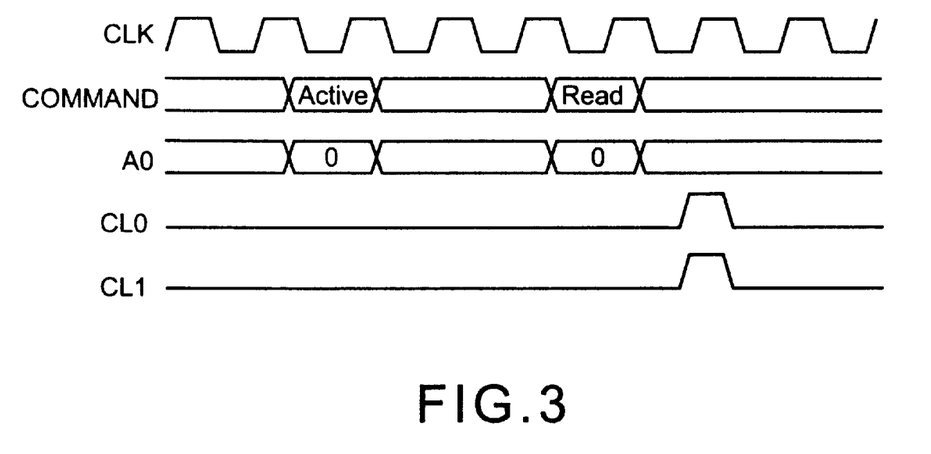
FIG. 3 is a timing chart for how to read out data from the synchronous DRAM of FIG. 1.

FIG. 3 shows how to read out data from a synchronous DRAM which has the burst length of two (2). The ACTIVE command is input from outside to make the synchronous DRAM operative and, at the same time, the address line A0=0 for the word line is input. Afterward, the Read command is input and, at the same time, address A0=0 (i.e., address to activate CL0 first) for a column-selection line corresponding to a memory cell which stores therein the data to be read out first is input.

Since the column-selection line address is 0 and the burst length is 2, the CL0 and CL1 are activated at the same time.

Figure 4:
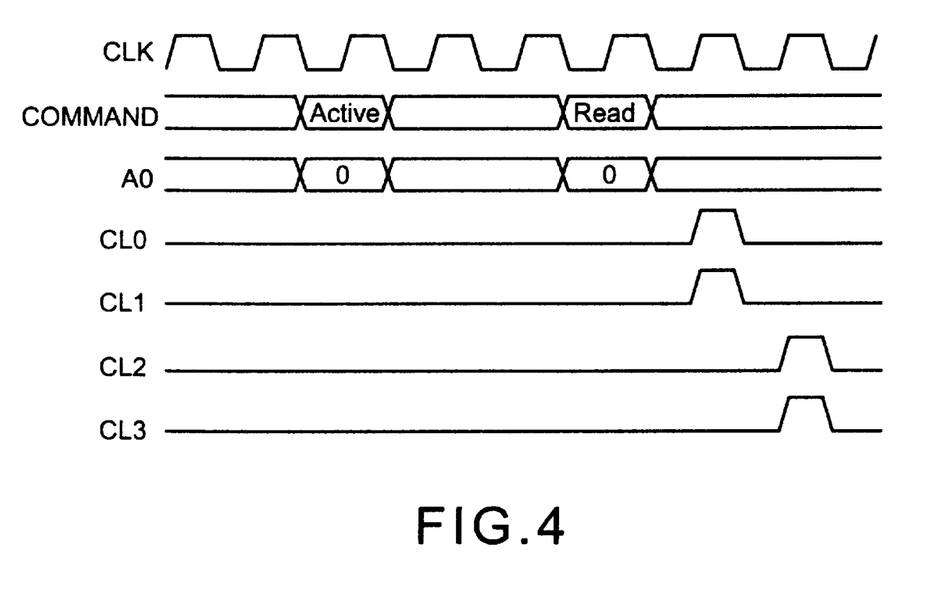
FIG. 4 is another timing chart for how to read out data from the synchronous DRAM of FIG. 1.

FIG. 4 shows how to read out data from a synchronous DRAM with the burst length of 4. The ACTIVE command to make the synchronous DRAM operative is input and, at the same time, address A=0 for the word line is input. Afterward, the Read command is input and, at the same time, address A=0 (i.e., address to activate CL0 first) for a column-selection line corresponding to the memory cell which stores therein the data to be read out first is input.

Since the column-selection line address is 0 and the burst length is 4, CL0 and CL1 are activated at the same time. Afterward, CL2 and CL3 are activated first.

Figure 5:
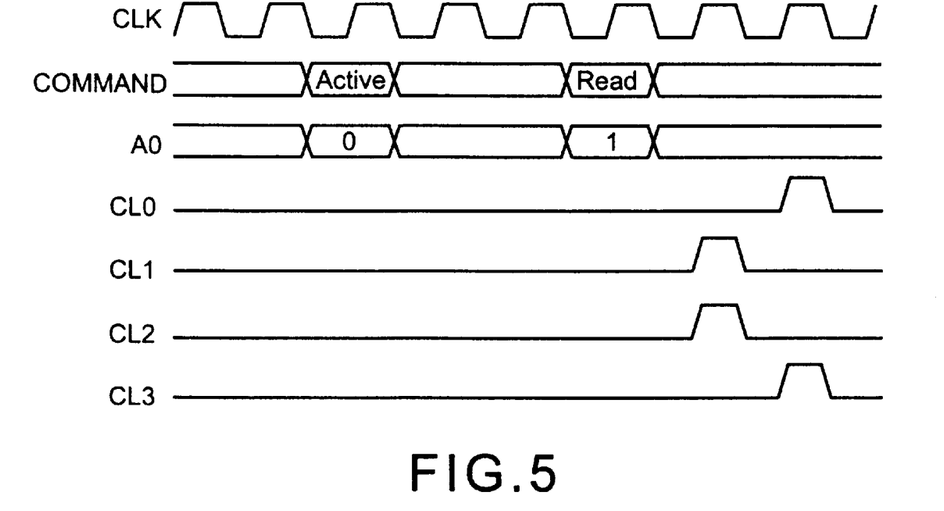
FIG. 5 is still another timing chart for how to read out data from synchronous DRAM of FIG. 1.

FIG. 5 shows how to read out data from another synchronous DRAM with the burst length of 4. The columns-selection line address A0=1 (i.e., address to activate CL1 first) IS INPUT.

Since the column-selection address is 1 and the burst length is 4, CL1 and CL2 are activated at the same first. Afterward, CL3 and CL0 are activated at the same time.

Figure 6:
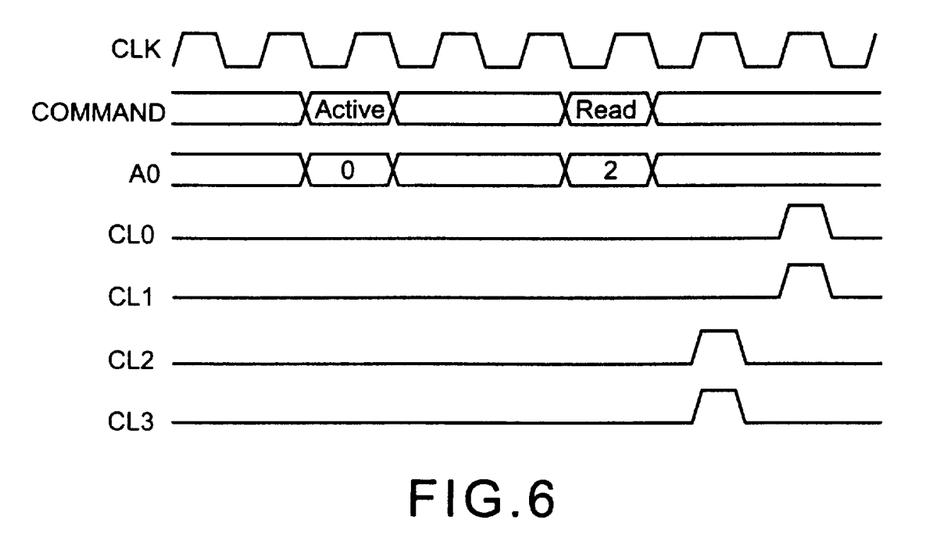
FIG. 6 is still another timing chart for how to read out data from synchronous DRAM of FIG. 1.

FIG. 6 shows how to read out data from still another synchronous DRAM with the burst length of 4. The column-selection address A0=2 (i.e., address to activated CL2 first) is input.

Since the column-selection address is 2 and the burst length is 4, CL2 and CL3 are activated at the same time. Afterward, CL0 and CL1 are activated at the same time.

Figure 7:
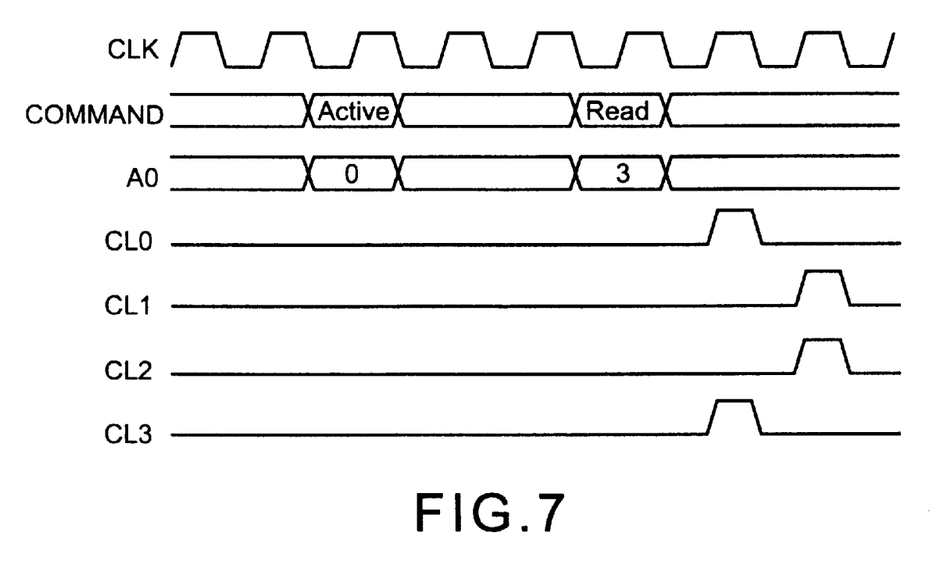
FIG. 7 is still another timing chart for the synchronous DRAM of FIG. 1.

FIG. 7 shows how to read out data from still another synchronous DRAM with burst length of 4. The column-selection line address A=3 (i.e., address to activate CL3 first) is input.

Since the column-selection line address is 3 and the burst length is 4, CL3 and CL0 are activated at the same time. Afterward, CL1 and CL2 are activated at the same time.

Figure 8:
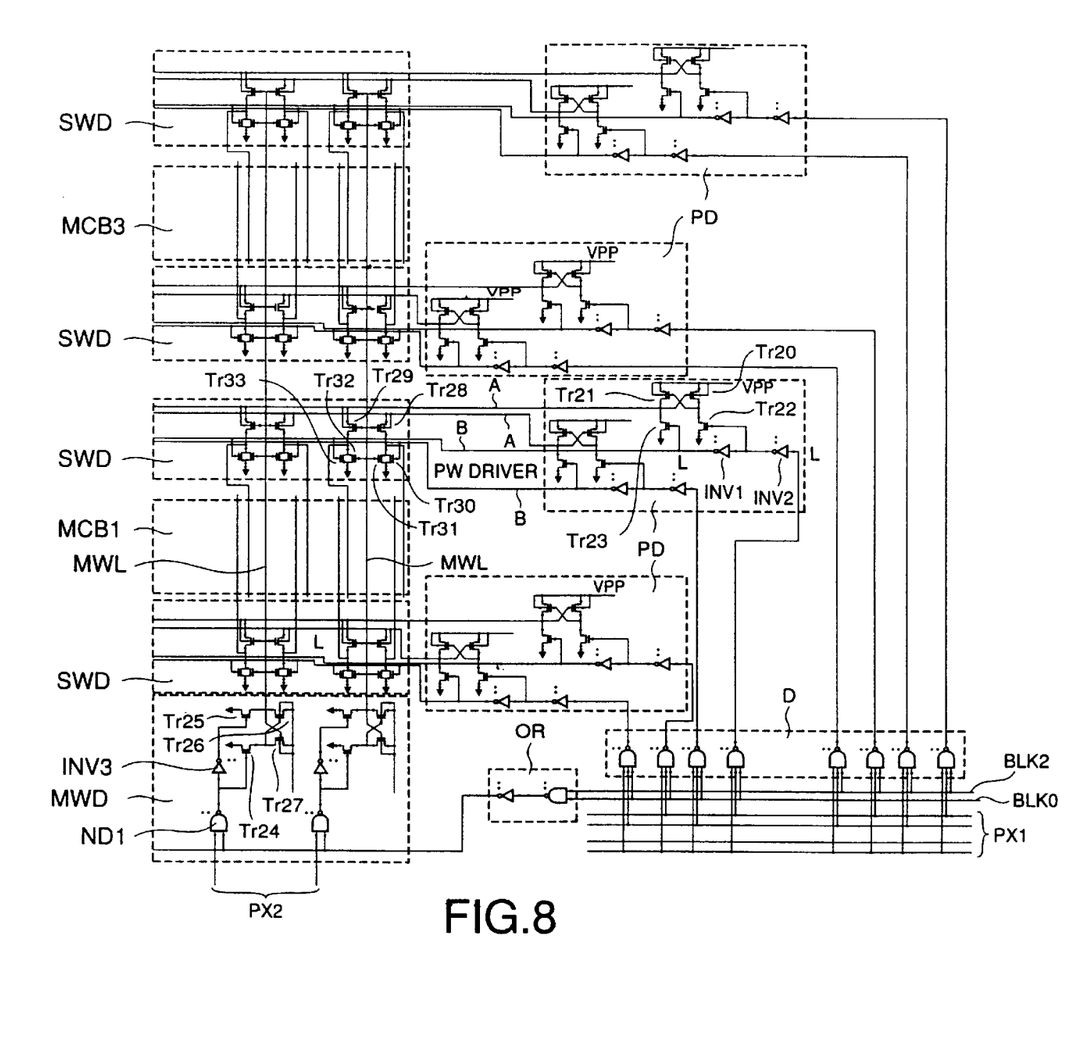
FIG. 8 is a variant of a circuit to select word lines for the synchronous DRAM of FIG. 1.

FIG. 8 shows a partial circuit diagram of the word line driver WD in FIG. 1.

The circuit shown in FIG. 8 is of a word-line-divided concept, with the word-line driving circuit for the first and third memory blocks. This circuit is given to select word lines on the left side of the sense-amplifiers SA in the first and third memory blocks.

A decoder circuit D is connected to the block-selection lines BLK0 and BLK2 and the first address line PX1. The decoder circuit D comprises a plurality of NAND circuits. At the time of read-out operations, one NAND circuit selected in response to the block-selection line and the first address line PX1 is set to a low level, setting the remaining circuits to a high level. Each of power drivers PD's has a plurality of driver circuits each of which comprises a circuit consisting of PMOS transistors Tr20 Tr21 and NMOS transistors Tr22 and Tr23 and a driver circuit consisting of inverters INV1 and INV2, being connected to the NAND circuit to which the decoder circuit D corresponds. PMOS transistor Tr21 is connected between a high-potential terminal and the gate of the PMOSTr 21. The PMOSTr 20 is connected between a high-potential terminal and the gate of the PMOS transistor Tr21. The gate of the PMOS transistor Tr20 is connected to a node A. The NMOS transistor Tr22 is connected between the gate of the PMOS transistor Tr21 and a low-potential terminal. The gate of the NMOS transistor Tr22 is connected to the output of the inverter INV2. The NMOS transistor Tr23 is connected between the node A and a low-potential terminal. The gate of the NMOS transistor Tr23 is connected to a node B, which is the output of INV1.

Each driver circuit of the power driver PD provides a high level of the corresponding node A and a low level of the corresponding node B when the output of the corresponding NAND circuit is of a low level.

The driver circuit of the power driver PD provides a low level of the corresponding node A and a high level of the corresponding node B when the output of the NAND circuit to be input is of a high level.

A main-word driver MWD is connected to the second X address line PX2 and also to the block-selection lines BLK0 and BLK2 via an OR circuit OR comprising an inverter INV and an NOR circuit NOR.

The main-word driver MWD has a plurality of driver circuits each of which comprises a NAND circuit ND1, an inverter INV3, PMOS transistors Tr26 and Tr27, and NMOS transistors Tr24 and Tr25. The PMOS transistor Tr26 is connected to a high-potential terminal and one end of the NMOS transistor Tr25. The PMOSTr 27 is connected to a high-potential terminal and one end of the NMOS transistor Tr24. The gate of the PMOS Tr26 is connected to one end of NMOS transistor Tr24, while the gate of the PMOS transistor Tr27 is connected to one end of the NMOS transistor Tr25. The other end of the NMOS transistor Tr25 is connected to a low-potential terminal, with its gate being connected to the output of the inverter INV3. The other end of the NMOS transistor Tr24 is connected to a low-potential terminal, with its gate being connected to the output of the NAND circuit ND1. The NMOS transistor Tr25 is connected to the main-word line MWD.

At the time of read-out operations, each word driver for the main-word driver MWD sets one of the main-word lines MWL to a low level based on the high-level address-selection line BLK0 or BLK2 and the high-level second X address line PX.

Each driver circuit for the main-word driver MWD sets the main-word line MWL to a high level when the output of the OR circuit is of a low level or the input signal of the second X address line is of a low level.

A sub-word driver SWD has a plurality of driver circuits each of which comprises PMOS transistors Tr28 and Tr29 and NMOS transistors Tr30, Tr31, Tr32, and Tr33. The PMOS transistor Tr29 is connected to one end of each of the node A, the NMOS transistor Tr32, and the NMOS transistor Tr33 connected to one driver circuit (hereinafter called first driver circuit) having the corresponding power driver PD. The other ends of the NMOS transistors Tr32 and Tr33 are connected to a low-potential terminal. The gate of the PMOS transistor Tr29 is connected to the corresponding main-word line MWL. The gate of the NMOS transistor Tr32 is connected to the corresponding main-word line MWL. The gate of the NMOS transistor Tr33 is connected to the node B which is connected to the first driver circuit of the power driver PD. To the interconnection of the PMOS transistor Tr29 and the NMOS transistor Tr33 is connected to the corresponding word line WL.

The PMOS transistor Tr28 is connected to one end of each of the NMOS transistors Tr30 and Tr31 and also to the node A connected to a driver circuit (hereinafter called second driver circuit) other than the first driver circuit of the corresponding power driver PD. The other ends of the NMOS transistors Tr30 and Tr31 are connected to a low-potential terminal. The gate of the PMOS transistor Tr28 is connected to the corresponding main-word line MWL. The gate of the NMOS transistor Tr31 is connected to the corresponding main-word line MWD. The gate of the NMOS transistor Tr30 is connected to the node B connected to the second driver of the power driver PD. To the interconnection of the PMOS transistor Tr28 and the NMOS transistor Tr30 is connected the corresponding word line WL.

Each driver circuit for the sub-word driver, when the node A of the corresponding driver circuit of the corresponding power driver PD becomes high, gives a high-level potential to the corresponding word line via the PMOS transistor Tr28 or Tr29 connected thereto.

Next, the following will explain the operations of the circuit shown in FIG. 8.

The case is described where one word line of the first memory block MCB1 becomes of a high-level potential.

First, the block-selection line BLK0 is given a high-level block selection signal.

The decoder circuit D sets to a low level only the output of one NAND circuit selected, by the first X address signal PX1, of the NAND circuits connected to the BLK0, thus setting to a high level the outputs of the remaining NAND circuits.

The nodes A and B connected to the first driver circuit of a power driver PD connected to the NAND circuit which is outputting a low level are set to a high level and a low level respectively. The nodes A and B connected to other drivers connected to the NAND circuit which is outputting a high level are set to a low level and a high level respectively.

Only the PMOS transistor Tr29 or Tr28 connected to the high-level node A is turned ON of those transistors of the driver circuit of a sub-word driver SWD which corresponds to the first memory block. The word line WL connected to thus turned-ON PMOS transistor Tr29 or Tr28 becomes high. The other word lines are held at a low level.

With reference to FIG. 8, the circuit is described which selects the word lines disposed on the left side of the sense-amplifiers in the first and third memory blocks. In FIG. 8, the block-selection signal BLK0 is replaced by BLK1 and the block-selection signal BLK2 is replaced by BLK3, to implement a circuit which selects the word lines disposed on the right side of the sense-amplifiers SA in the first and third memory blocks. In FIG. 8, also, the block-selection signal BLK0 is replaced by BLK2, the block-selection signal BLK2 is replaced by BLK0, the first memory block MCB1 is replaced by the second memory block MCB2, and the third memory block MCB3 is replaced by the fourth memory block MCB4, to implement a circuit which selects the word lines disposed on the left sides of the sense-amplifiers SA in the second and fourth memory blocks. Also, in FIG. 8, the block-selection line BLK0 is replaced by BLK3, the block-selection line BLK2 is replaced by BLK1, the first memory block MCB1 is replaced by the second memory block MCB2, and the third memory block is replaced by the fourth memory block MCB4, to implement a circuit which selects the word lines disposed on the right sides of the sense-amplifiers SA in the second and fourth memory blocks.

As can be seen from FIG. 8, the first and third memory blocks MCB1 and MCB3 can utilize the main-word drivers in common, thus reducing the area of the circuits.

What is claimed is:

1. A semiconductor memory device comprising:
    a first pair of data lines and a second pair of data lines;
    a plurality of first and second column-selection signal lines for transferring a plurality of column-selection signals;
    a block selection signal line for transferring a block selection signal;
    a first memory block including
        a plurality of memory cells,
        a plurality of word lines connected to the memory cells,
        a plurality of a pairs of bit lines, each of which is connected to the memory, cells,
        a plurality of column switch circuits each of which is connected to one of the first column-selection signal lines, one of the pairs of the bit lines and the first pair of data lines, the column switch circuit transferring data on the pairs of bit lines to the first pair of data lines in response to the column selection signal, and
        a control circuit connected to said block selection signal line, the control circuit enabling said first memory block in response to the block selection signal;
    a second memory block including
        a plurality of memory cells,
        a plurality of word lines connected to the memory cells,
        a plurality of pairs of bit lines, each of which is connected to the memory, cells,
        a plurality of column switch circuits each of which is connected to one of the first column-selection signal lines, one of the pairs of the bit lines and the second pair of data lines, the column switch circuit transferring data on the pairs of bit lines to the second pair of data lines in response to the column selection signal, and
        a control circuit connected to said block selection signal line, the control circuit enabling said second memory block in response to the block selection signal;
    a third memory block including
        a plurality of memory cells,
        a plurality of word lines connected to the memory cells,
        a plurality of pairs of bit lines, each of which is connected to the memory, cells,
        a plurality of column switch circuits each of which is connected to one of the second column-selection signal lines, one of the pairs of the bit lines and the first pair of data lines, the column switch circuit transferring data on the pairs of bit lines to the first pair of data lines in response to the column selection signal, and
        a control circuit connected to said block selection signal line, the control circuit enable said third memory block in response to the block selection signal; and
    a fourth memory block including
        a plurality of memory cells,
        a plurality of word lines connected to the memory cells,
        a plurality of pairs of bit lines, each of which is connected to the memory, cells,
        a plurality of column switch circuits each of which is connected to one of the second column-selection signal lines, one of the pairs of bit lines and the second pair of data lines, the column switch circuit transferring data on the pairs of it lines to the second pair of data lines in response to the column selection signal, and
        a control circuit connected to said block selection signal line, the control circuit enabling said fourth memory block in response to the block selection signal.

2. A semiconductor device according to claim 1, further comprising an address line for transferring an address signal, wherein each of said first to fourth memory blocks further comprises a plurality of word line drivers each of which is connected to one of the word lines, the address line and the block selection signal line, the word line driver selectively activates the corresponding word line in response to the block selection signal and the address signal.

3. A semiconductor device according to claim 1, further comprising an active signal line for transferring an active signal connected to the control circuits of the first to fourth memory blocks and wherein the control circuit enable to the first to fourth memory blocks, respectively, in response to the block selection signal and the active signal.

4. A semiconductor device according to claim 1, wherein said block selection signal line includes a plurality of selection lines.

5. A semiconductor device according to claim 1, wherein said control circuits of said first and third memory blocks simultaneously enable said first and third memory blocks, respectively, and wherein said control circuits of said second and fourth memory blocks simultaneously enable said second and fourth memory blocks, respectively.

6. A semiconductor memory device comprising:
    a plurality of pairs of data lines including a first pair of data lines and a second pair of data lines;

a plurality of column selection signal lines for transferring a plurality of column selection signals, said column selection signal lines including a plurality of first column selection signal lines and a plurality of second column selection signal lines;

a block selection signal line for transferring a block selection signal line; and a plurality of memory blocks each of which includes
a plurality of memory cells,
a plurality of word lines connected to the memory cells,
a plurality of pairs of bit lines, each of which is connected to the memory, cells,
a plurality of column switch circuits each of which has a control terminal connected to one of the column selection signal lines, a first terminal connected to one of the pairs of the bit lines, the column switch circuit transferring data on the pair of bit lines, the column switch circuit transferring data on the pair of bit lines to the pair of data lines in response to the column selection signal, and
a control circuit connected to said block selection signal line, the control circuit enabling the memory block in response to the block selection signal, said memory blocks including first, second, third and fourth memory blocks, and wherein each of the control terminals of the column switch circuits of the first and second memory blocks are commonly connected to one of the first column selection signal lines respectively, and each of the control terminals of the column switch circuits of the third and fourth memory blocks are commonly connected to one of the second column selection signal lines respectively, and wherein the second terminals of the column switch circuits of the first and third memory blocks are commonly connected to the first pair of data lines, and the second terminals of the column switch circuits of the second and fourth memory blocks are commonly connected to the second pair of data lines.

7. A semiconductor device according to claim 6, further comprising an address line for transferring an address signal, wherein each of the memory blocks further comprises a plurality of word line drivers each of which is connected to one of the word lines, the address line and the block selection signal line, the word line driver selectively activates the corresponding word line in response to the block selection signal and the address signal.

8. A semiconductor device according to claim 6, further comprising an active signal line for transferring an active signal connected to the control circuits of the memory blocks and wherein the control circuits enable the corresponding memory block, respectively, in response to the block selection signal and the active signal.

9. A semiconductor device according to claim 6, wherein said block selection signal line includes a plurality of selection lines.

10. A semiconductor device according to claim 6, wherein said control circuits of said first and third memory blocks simultaneously enable said first and third memory blocks, respectively, and wherein said control circuits of said second and fourth memory blocks simultaneously enable said second and fourth memory blocks, respectively.

11. A semiconductor device according to claim 6, wherein each of said memory blocks further includes a plurality of sense amplifiers each of which is connected to one of the pairs of bit lines, and wherein the control circuit enables the sense amplifiers.

12. A semiconductor device according to claim 11, wherein each of said memory blocks further includes a plurality of transfer circuits each of which is connected between one of the pairs of bit lines and one of the sense amplifiers, and wherein the control circuit enables the transfer circuits.

13. A semiconductor device according to claim 6, wherein each of said memory blocks further includes a plurality of equalizing circuits each of which is connected to one of the pairs of bit lines, and wherein the control circuit enables the equalizing circuits.

14. A semiconductor device according to claim 6, wherein only one column selection signal on the one of the first column-selection signal lines is activated.

15. A semiconductor device according to claim 6, wherein only one column selection signal on the second column-selection signal lines is activated.

16. A semiconductor memory device comprising:
a first pair of data lines;
a second pair of data lines;
a plurality of first column selection signal lines each of which transfers a first column selection signals;
a plurality of second column selection signal lines each of which transfers a second column selection signal; and
a plurality of memory blocks each of which includes
a plurality of memory cells,
a plurality of word lines connected to the memory cells,
a plurality of pairs of bit lines, each of which is connected to the memory, cells,
a plurality of column switch circuits each of which has a control terminal, a first terminal connected to one of the pairs of the bit lines and a second terminal, the column switch circuit transferring data on the pair of bit lines to the second terminal thereof in response to a signal received to the control terminal thereof, and
a control circuit enabling the memory block in response to a signal received thereto, said memory blocks including first, second, third and fourth memory blocks, and wherein each of the control terminals of the column switch circuits of the first and second memory blocks are commonly connected to one of the first column selection signal lines respectively, and each of the control terminals of the column switch circuits of the third and fourth memory blocks are commonly connected to one of the second column selection signal lines respectively, wherein the second terminals of the column switch circuits of the first and third memory blocks are commonly connected to said first pair of data lines, and the second terminals of the column switch circuits of the second and fourth memory blocks are commonly connected to said second pair of data lines, and wherein the control circuits of the first and third memory blocks commonly receives a first block selection signal and the control circuits of the second and fourth memory blocks commonly receives a second block selection signal.

17. A semiconductor device according to claim 16, further comprising an address line for transferring an address signal,
wherein each of the memory blocks further comprises a plurality of word lines and the address line,
wherein the word line drivers of the first and third memory blocks selectively activates the word line in response to the first block selection signal and the address signal, and wherein the word line drivers of the second and fourth memory blocks selectively activates the word line in response to the second block selection signal and the address signal.

18. A semiconductor device according to claim 16, further comprising an active signal line for transferring an active signal connected to the control circuits of the memory blocks.

19. A semiconductor device according to claim 16, wherein each of said memory blocks further includes a plurality of sense amplifiers each of which is connected to one of the pairs of bit lines, and wherein the control circuit enables the sense amplifiers.

20. A semiconductor device according to claim 19, wherein each of said memory blocks further includes a plurality of transfer circuits each of which is connected between one of the pairs of bit lines and one of the sense amplifiers, and wherein the control circuit enables the transfer circuits.

21. A semiconductor device according to claim 16, wherein each of said memory blocks further includes a plurality of equalizing circuits each of which is connected to one of the pairs of bit lines, and wherein the control circuit enables the equalizing circuits.

* * * * *